(12) United States Patent
Yang

(10) Patent No.: US 9,759,941 B2
(45) Date of Patent: Sep. 12, 2017

(54) ARRAY SUBSTRATE USED IN LIQUID CRYSTAL PANEL AND MANUFACTURING METHOD FOR THE SAME

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Zuyou Yang, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 87 days.

(21) Appl. No.: 14/901,250

(22) PCT Filed: Nov. 27, 2015

(86) PCT No.: PCT/CN2015/095816
§ 371 (c)(1),
(2) Date: Dec. 28, 2015

(87) PCT Pub. No.: WO2017/088179
PCT Pub. Date: Jun. 1, 2017

(65) Prior Publication Data
US 2017/0199407 A1    Jul. 13, 2017

(30) Foreign Application Priority Data
Nov. 24, 2015 (CN) .......................... 2015 1 0827673

(51) Int. Cl.
*H01L 29/786* (2006.01)
*G02F 1/1333* (2006.01)
(Continued)

(52) U.S. Cl.
CPC ........ *G02F 1/13338* (2013.01); *G02F 1/1368* (2013.01); *G02F 1/13439* (2013.01);
(Continued)

(58) Field of Classification Search
CPC ......... H01L 29/78633; H01L 29/78675; G02F 1/13338; G02F 1/133345; G02F 1/13439;
(Continued)

(56) References Cited

U.S. PATENT DOCUMENTS

2013/0077034 A1*  3/2013  Jung .................... G02F 1/1345
                                                         349/122
2013/0194224 A1*  8/2013  Lai ....................... G06F 3/0412
                                                         345/174

* cited by examiner

*Primary Examiner* — Whitney T Moore
*Assistant Examiner* — Joseph Galvin, III
(74) *Attorney, Agent, or Firm* — Andrew C. Cheng

(57) ABSTRACT

An array substrate is provided. The array substrate includes: a substrate; a LTPS TFT disposed above the substrate; a planarization layer covering the LTPS TFT; a via hole formed in the planarization layer, wherein the via hole reveals a drain electrode of the LTPS TFT; multiple common electrodes and receiving electrodes disposed separately on the planarization layer, wherein the multiple common electrode function as a driving electrode in a touch stage, and the multiple common electrodes which are disposed separately are connected with each other; a passivation layer which covers the multiple common electrodes and the multiple receiving electrodes and the planarization layer; and a pixel electrode disposed on the passivation layer, wherein, the pixel electrode is contacted with the drain electrode through the via hole. A manufacturing method for the array substrate is also provided. The present invention can reduce one manufacturing process and decrease production cost.

13 Claims, 2 Drawing Sheets

(51) Int. Cl.
*G02F 1/1362* (2006.01)
*G02F 1/1368* (2006.01)
*G02F 1/1343* (2006.01)
*H01L 27/12* (2006.01)

(52) U.S. Cl.
CPC .. *G02F 1/133345* (2013.01); *G02F 1/136209* (2013.01); *G02F 1/136227* (2013.01); *G02F 2001/13685* (2013.01); *G02F 2001/134318* (2013.01); *G02F 2001/136231* (2013.01); *G02F 2201/121* (2013.01); *G02F 2202/104* (2013.01); *H01L 27/1248* (2013.01); *H01L 29/78633* (2013.01); *H01L 29/78675* (2013.01)

(58) Field of Classification Search
CPC ......... G02F 1/136209; G02F 1/136227; G02F 1/1368; G02F 1/134318; G02F 1/136231; G02F 1/13685
See application file for complete search history.

ARRAY SUBSTRATE USED IN LIQUID CRYSTAL PANEL AND MANUFACTURING METHOD FOR THE SAME

BACKGROUND OF THE INVENTION

1. Field of the Invention

The present invention relates to a liquid crystal display technology field, and more particularly to an array substrate used in liquid crystal panel and manufacturing method for the same.

2. Description of Related Art

Along with the development of the optical and semiconductor technology, the flat panel display also develops vigorously. In many flat displays, the liquid crystal display has become the mainstream of the market because of superior characteristics of high space utilizing rate, low power consumption, no radiation, and low electromagnetic interference.

Currently, a-Si TFT is widely used as a switching element of the LCD. However, the a-Si TFT is limited in meeting the requirements of thin, lightweight, high-definition, high brightness, high reliability, low power consumption. Comparing with the a-Si TFT, the low-temperature poly-silicon (LTPS) TFT LCD has obvious advantages for satisfying the above requirements.

On the other hand, along with the popularity of intelligent electronic products, a capacitive touch screen has been widely used in various electric productions such as cell phone, tablet and so on. Currently, common capacitive touch screens are One Glass Solution (OGS), On-Cell type and In-Cell type. Wherein, because the In-Cell type has an advantage in the manufacturing process, comparing with the OGS and On-Cell technology, the In-Cell type has advantages of lighter, better light transmission, more stable in structure and so on.

After research, the applicants find that in manufacturing the LTPS touch screen using the In-Cell technology, two manufacturing processes are required to finish a driving electrode Tx and a receiving electrode so that the conventional technology exists a technology problem of too complex in the manufacturing process of the array substrate.

SUMMARY OF THE INVENTION

In order to solve the above technology problems existed in the conventional art, an object of the present invention is to provide an array substrate used in a liquid crystal panel, comprising: a substrate; a low-temperature poly-silicon thin-film transistor (LTPS TFT) disposed above the substrate; a planarization layer which covers the LTPS TFT; a via hole formed in the planarization layer, wherein, the via hole reveals a drain electrode of the LTPS TFT; multiple common electrodes and multiple receiving electrodes which are disposed separately on the planarization layer, wherein, the multiple common electrode function as a driving electrode in a touch stage, and the multiple common electrodes which are disposed separately are connected with each other; a passivation layer which covers the multiple common electrodes and the multiple receiving electrodes and the planarization layer; and a pixel electrode disposed on the passivation layer, wherein, the pixel electrode is contacted with the drain electrode through the via hole.

Furthermore, the array substrate further includes: a third through hole in the passivation layer, wherein the third through hole reveals the common electrode; a connection electrode which is not contacted with the pixel electrode on the passivation layer; and wherein, the connection electrode is contacted with the common electrodes through the third through hole such that the multiple common electrodes which are disposed separately are connected with each other.

Furthermore, the multiple common electrodes and the multiple receiving electrodes are formed simultaneously.

Furthermore, the pixel electrode and the connection electrode are formed simultaneously.

Furthermore, the array substrate further includes: a light-shielding layer disposed between the substrate and the LTPS TFT, wherein, the light-shielding layer is disposed oppositely to the LTPS TFT; and a first insulation layer disposed between the light-shielding layer and the LTPS TFT, wherein, the first insulation layer covers the light-shielding layer and the substrate.

Furthermore, wherein, the LTPS TFT includes: a polysilicon layer disposed on the first insulation layer; a second insulation layer which covers the polysilicon layer on the first insulation layer; a gate electrode disposed on the second insulation layer; a third insulation layer which covers the gate electrode on the second insulation layer; a first through hole and a second through hole in the second insulation layer and the third insulation layer, wherein, the first through hole and the second through hole reveal a surface of the polysilicon layer; and a source electrode and the drain electrode disposed on the third insulation layer, wherein, the source electrode fills the first through hole and contacts the surface of the polysilicon layer, and the drain electrode fills the second through hole and contacts the surface of the polysilicon layer; wherein, the planarization layer is disposed on the third insulation layer and covers the source electrode and the drain electrode.

An object of the present invention is to provide a manufacturing method for an array substrate of a liquid crystal panel, comprising: providing a substrate; forming a low-temperature poly-silicon thin-film transistor (LTPS TFT) above the substrate; forming a planarization layer which covers the LTPS TFT; forming a via hole in the planarization layer, wherein, the via hole reveals a drain electrode of the LTPS TFT; simultaneously forming multiple common electrodes and multiple receiving electrodes which are disposed separately on the planarization layer, wherein, the multiple common electrodes function as a driving electrode in a touch stage, and the multiple common electrodes which are disposed separately are connected with each other; forming a passivation layer which covers the multiple common electrodes and the multiple receiving electrodes and the planarization layer; and forming a pixel electrode on the passivation layer, wherein, the pixel electrode is contacted with the drain electrode through the via hole.

Furthermore, the manufacturing method further includes: after forming the passivation layer, forming a third through hole in the passivation layer, wherein the third through hole reveals the common electrode; when forming the pixel electrode, simultaneously forming a connection electrode which is not contacted with the pixel electrode on the passivation layer; and wherein, the connection electrode is contacted with the common electrodes through the third through hole such that the multiple common electrodes which are disposed separately are connected with each other.

Furthermore, the manufacturing method further includes: before forming the LTPS TFT, forming a light-shielding layer on the substrate, wherein, the light-shielding layer is disposed oppositely to the LTPS TFT; and forming a first insulation layer which covers the light-shielding layer on the substrate.

Furthermore, the step of forming a LTPS TFT includes: forming a polysilicon layer on the first insulation layer; forming a second insulation layer which covers the polysilicon layer on the first insulation layer; forming a gate electrode on the second insulation layer; forming a third insulation layer which covers the gate electrode on the second insulation layer; forming a first through hole and a second through hole in the second insulation layer and the third insulation layer, wherein, the first through hole and the second through hole reveal a surface of the polysilicon layer; and forming a source electrode and the drain electrode on the third insulation layer, wherein, the source electrode fills the first through hole and contacts the surface of the polysilicon layer, and the drain electrode fills the second through hole and contacts the surface of the polysilicon layer; wherein, the planarization layer is disposed on the third insulation layer and covers the source electrode and the drain electrode.

The beneficial effects of the present invention, the present invention forms the common electrodes which function as a driving electrode in a touch stage and the receiving electrodes in a same manufacturing process. Comparing with the conventional art that requires two manufacturing processes to form the driving electrode and the receiving electrode, one manufacturing process is reduced so as to simplify the manufacturing process of the LTPS TFT array substrate and reduce the production cost.

BRIEF DESCRIPTION OF THE DRAWINGS

In order to more clearly illustrate the technical solution in the present invention or in the prior art, the following will illustrate the figures used for describing the embodiments or the prior art. The features and benefits of the present embodiments will become clearer. In the figures.

DETAILED DESCRIPTION OF THE PREFERRED EMBODIMENT

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications.

In the figures, in order to illustrate the devices clearly, thickness of the layers and regions are enlarged. A same numeral in the entire specification and figures represents a same device.

It should be noted that, herein, relational terms such as first and second, and the like are only used to distinguish one entity or operation from another entity or operation. It is not required or implied that these entities or operations exist any such relationship or order between them. The terms are only used to distinguish one element from another element.

It can also be understood that when a layer or an element is called be to "above" or "on" another layer or substrate. The layer or the element can directly form on the another layer or the substrate, or intermediate layer or intermediate element can exist.

Figure 1:
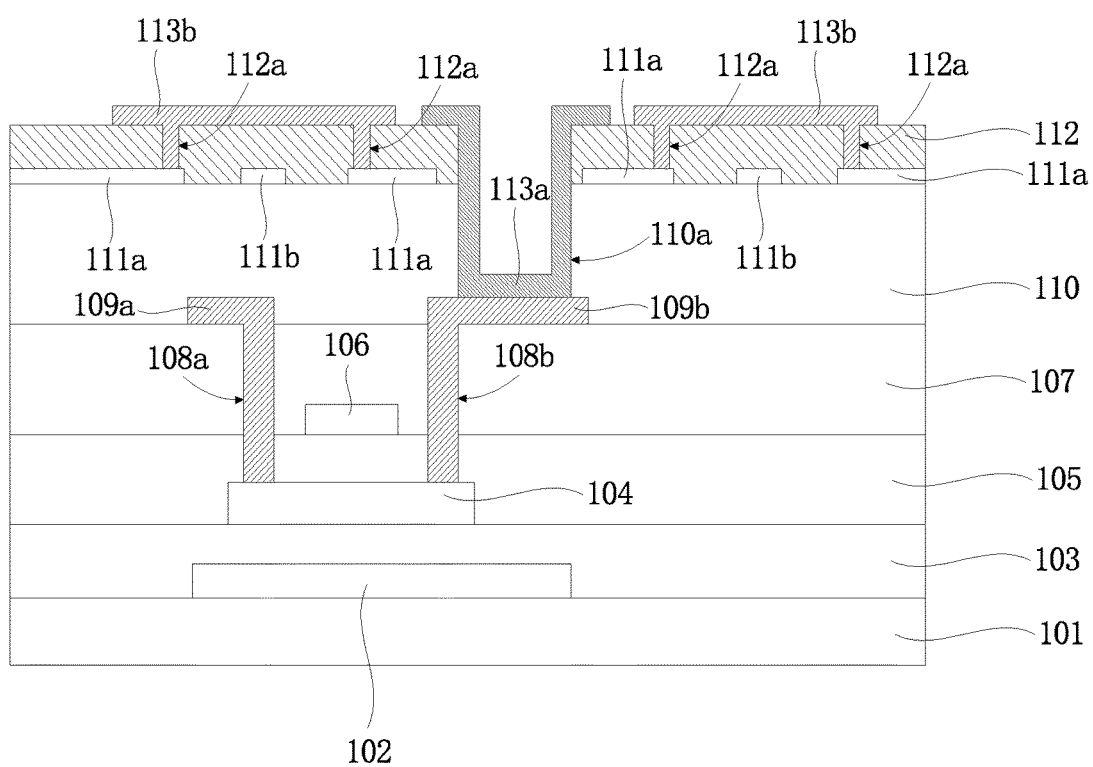
FIG. 1 is a schematic diagram of a portion structure of a Low-Temperature Poly-silicon Thin-Film Transistor (LTPS TFT) array substrate according to an embodiment of the present invention.

FIG. 1 is a schematic diagram of a portion structure of a Low-Temperature Poly-silicon Thin-Film Transistor (LTPS TFT) array substrate according to an embodiment of the present invention.

With reference to FIG. 1, firstly, providing a substrate 101. In the present embodiment, the substrate 101 is a transparent glass substrate. However, the present invention is not limited. For example, the substrate 101 can also be a transparent resin substrate.

Then, forming a light-shielding layer 102 on the substrate 101. In the present embodiment, the light shielding layer 102 is disposed oppositely to a Low-Temperature Poly-silicon Thin-Film Transistor (LTPS TFT) which will be formed later such that the light-shielding layer 102 shield a light for a channel of the LTPS TFT in order to prevent the LTPS TFT from generating a leakage current because of irradiating a light to the LTPS TFT.

Furthermore, the light-shielding layer 102 is disposed right oppositely to the LTPS TFT. That is, in FIG. 1 and from bottom to top, the light-shielding layer 102 completely blocks the LTPS TFT which will be formed later. In the present embodiment, the light-shielding layer 102 can be formed by a black metal material such as chromium, molybdenum or a combination of chromium and molybdenum. However, the present invention is not limited.

Then, forming a first insulation layer 103 covering the light-shielding layer 102 on the substrate 101. That is, the light-shielding layer 102 is directly formed on the substrate 101, the first insulation layer 103 is directly formed on the substrate 101 and covering the light-shielding layer 102 such that the LTPS TFT which will be formed subsequently is directly formed on the first insulation layer 103. In the present embodiment, the first insulation layer 103 is formed by silicon nitride and/or silicon oxide. For example, the first insulation layer 103 can include a silicon nitride layer and a silicon oxide layer stacked from bottom to top. However, the present invention is not limited.

The following content will refer to FIG. 1 for specifically explaining the structure of the LTPS TFT. It can be understood that the structure of the LTPS TFT provided here only function as an example, and the structure of the LTPS TFT is not limited.

With reference to FIG. 1, firstly, forming a polysilicon layer 104 on the first insulation layer 103. Wherein, the polysilicon layer 104 is used for forming a channel for moving carriers. Here, the forming method of the polysilicon layer 104 can refer to the forming method in the conventional art. No more repeating. Here, the present invention can also perform an N-type doping at two terminals of the polysilicon layer 104. By this way, a source electrode and a drain electrode which will be formed subsequently are respectively contacted with N-type doping regions at the two terminals of the polysilicon layer 104.

Then, forming a second insulation layer 105 covering the polysilicon layer 104 on the first insulation layer 103. In the present embodiment, the second insulation layer 105 is formed by silicon nitride and/or silicon oxide. For example, the second insulation layer 105 includes a silicon nitride layer and a silicon oxide layer stacked from bottom to top. However, the present invention is not limited.

Then, forming a gate electrode 106 on the second insulation layer 105. Here, the gate electrode 106 can be formed by a conductive metal material such as molybdenum. However, the present invention is not limited.

Then, forming a third insulation layer 107 covering the gate electrode 106 on the second insulation layer 105. In the present embodiment, the third insulation layer 107 is formed by silicon nitride and/or silicon oxide. For example, the third insulation layer 107 includes a silicon nitride layer and a silicon oxide layer stacked from bottom to top. However, the present invention is not limited.

Then, forming a first through hole 108a and a second through hole 108b in the second insulation layer 105 and the third insulation layer 107. Wherein, the first through hole 108a and the second through hole 108b reveal a surface of the polysilicon layer 104. Here, if performing the N-type doping at the two terminals of the polysilicon layer 104, the first through hole 108a and the second through hole 108b will reveal the N-type doping regions at the two terminals of the polysilicon layer 104. Besides, the first through hole 108a and the second through hole 108b can be formed through exposing and developing the third insulation layer 107 and the second insulation layer 105.

Finally, forming a source electrode 109a and a drain electrode 109b on the third insulation layer 107. Wherein, the source electrode 109a fills the first through hole 108a and contacts the surface of the polysilicon layer 104, and the drain electrode 109b fills the second through hoe 108b and contacts with the surface of the polysilicon layer 104. In the present embodiment, if the N-type doping is performed at the two terminals of the polysilicon layer 104, the source electrode 109a and the drain electrode 109b are respectively contacted with the N-type doping regions at the two terminals of the polysilicon layer 104. Besides, the source electrode 109a and the drain electrode 109b can be made by molybdenum, aluminum, or molybdenum alloy. However, the present invention is not limited.

The following content will continue to refer to FIG. 1 for illustrating the manufacturing of the Low-Temperature Poly-silicon Thin-Film Transistor (LTPS TFT) array substrate according to an embodiment of the present invention.

With reference to FIG. 1, after the LTPS TFT is finished, forming a planarization layer 110 which covers the source electrode 109a and the drain electrode 109b on the third insulation layer 107. In the present embodiment, the planarization layer 110 is made by an organic material. However, the present invention is not limited.

Then, forming a via hole 110a in the planarization layer 110. Wherein, the via hole 110a reveals the drain electrode 109b of the LTPS TFT. In the present embodiment, an exposure and development method is utilized to form the via hole 110a in the planarization layer 110. However, the present invention is not limited.

Then, simultaneously forming multiple common electrodes 111a and multiple receiving electrodes 111b which are disposed separately on the planarization layer 110. In the present embodiment, the LTPS TFT array substrate according to an embodiment of the present invention can be applied for a display or a touch scanning in a time-division manner. When displaying an image (a display stage), the common electrode 111a provide a common voltage to a corresponding pixel unit so that an electric field is formed between the common voltage 111a and a pixel electrode which will be formed later, and one common electrode 111a can correspond to one or multiple pixel units. When touch scanning (a touch stage), the common electrodes 111a can function as a driving electrode for generating a driving signal.

Besides, in the present embodiment, the multiple common electrodes 111a and multiple receiving electrodes 111b can be simultaneously made by an indium-tin-oxide (ITO) material. However, the present invention is not limited. For example, the multiple common electrodes 111a and multiple receiving electrodes 111b can also be simultaneously made by a graphene, a carbon nanotube or a nano-silver material having a high transmittance rate and a low impedance.

Then, forming a passivation layer 112 which covers the common electrodes 111a, the receiving electrodes 111b and the planarization layer 110. Wherein, the passivation layer 112 fills intervals between the common electrodes 111a and the receiving electrodes 111b. In the present embodiment, the passivation layer 112 is not formed in the via hole 110a when forming the passivation layer 112. Or, a portion of the passivation layer 112 is formed in the via hole 110a when forming the passivation layer 112, and then, removing the portion of the passivation layer 112 formed in the via hole 110a. The present invention is not specifically limited. Besides, the passivation layer 112 is formed by an insulation material.

Then, forming multiple third through holes 112a in the passivation layer 112. Wherein, the multiple third through holes 112a reveal the common electrodes 111a. In the present embodiment, an exposure and development method can be utilized in the passivation layer 112 in order to form the third through holes 112a. However, the present invention is not limited.

Then, simultaneously forming a pixel electrode 113a and a connection electrode 113b which are not contacted with each other on the passivation layer 112. Wherein, the pixel electrode 113a is contacted with the drain electrode 109b of the LTPS TFT through the via hole 110a, and the connection electrode 113b is contacted with the common electrodes 111a through the third through holes 112a so that the common electrodes 111a which are disposed separately are connected with each other. In the present embodiment, the pixel electrode 113a and the connection electrode 113b can be simultaneously made by an indium-tin-oxide (ITO) material. However, the present invention is not limited. For example, the pixel electrode 113a and the connection electrode 113b can also be simultaneously made by a graphene, a carbon nanotube or a nano-silver material having a high transmittance rate and a low impedance.

In summary, the present invention forms the common electrodes 111a which function as a driving electrode in a touch stage and the receiving electrodes 111b in a same manufacturing process. Comparing with the conventional art that requires two manufacturing processes to form the driving electrode and the receiving electrode, one manufacturing process is reduced so as to simplify the manufacturing process of the LTPS TFT array substrate and reduce the production cost.

Figure 2:
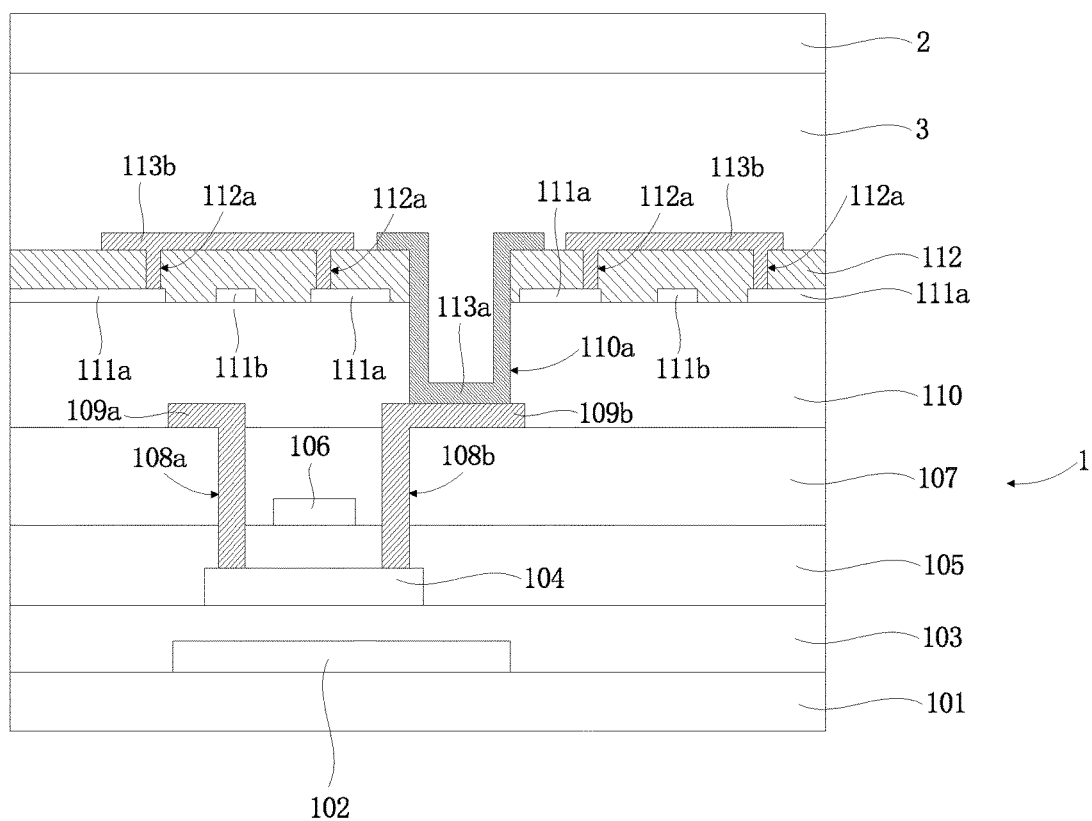
FIG. 2 is a schematic diagram of a portion structure of a liquid crystal panel according to an embodiment of the present invention.

FIG. 2 is a schematic diagram of a portion structure of a liquid crystal panel according to an embodiment of the present invention.

With reference to FIG. 2, the liquid crystal panel according to an embodiment of the present invention includes: the LTPS array substrate 1 shown in FIG. 1, a color filter substrate 2 aligned with the LTPS array substrate 1 and a liquid crystal layer 3 clamped between the LTPS array substrate 1 and the color filter substrate 2. Wherein, the liquid crystal layer 3 includes multiple liquid crystal molecules.

Here, the color filter substrate 2 generally includes: a substrate, a color filter on the substrate, a black matrix and other suitable devices. Because the above elements belong to the conventional art, the specific structure of the color filter substrate 2 can refer to a color filter substrate of the conventional art. No more repeating for the color filter substrate 2.

Although the present content has referred to specific embodiments for describing the present invention, however, person skilled in the art can understand that leaving the spirit and scope defined by the claims and the equivalents, various changes in forms and details can be executed.

What is claimed is:

1. An array substrate used in a liquid crystal panel, comprising:
    a substrate;
    a low-temperature poly-silicon thin-film transistor (LTPS TFT) disposed above the substrate;
    a planarization layer which covers the LTPS TFT;
    a via hole formed in the planarization layer, wherein, the via hole reveals a drain electrode of the LTPS TFT;
    multiple common electrodes and multiple receiving electrodes which are disposed separately on the planarization layer, wherein, the multiple common electrode function as a driving electrode in a touch stage, and the multiple common electrodes which are disposed separately are connected with each other;
    a passivation layer which covers the multiple common electrodes and the multiple receiving electrodes and the planarization layer; and
    a pixel electrode disposed on the passivation layer, wherein, the pixel electrode is contacted with the drain electrode through the via hole.

2. The array substrate according to claim 1, wherein, the array substrate further includes:
    a third through hole in the passivation layer, wherein the third through hole reveals the common electrode; and
    a connection electrode which is not contacted with the pixel electrode on the passivation layer;
    wherein, the connection electrode is contacted with the common electrodes through the third through hole such that the multiple common electrodes which are disposed separately are connected with each other.

3. The array substrate according to claim 1, wherein, the multiple common electrodes and the multiple receiving electrodes are formed simultaneously.

4. The array substrate according to claim 2, wherein, the multiple common electrodes and the multiple receiving electrodes are formed simultaneously.

5. The array substrate according to claim 2, wherein, the pixel electrode and the connection electrode are formed simultaneously.

6. The array substrate according to claim 1, wherein, the array substrate further includes:
    a light-shielding layer disposed between the substrate and the LTPS TFT, wherein, the light-shielding layer is disposed oppositely to the LTPS TFT; and
    a first insulation layer disposed between the light-shielding layer and the LTPS TFT, wherein, the first insulation layer covers the light-shielding layer and the substrate.

7. The array substrate according to claim 5, wherein, the LTPS TFT includes:
    a polysilicon layer disposed on the first insulation layer;
    a second insulation layer which covers the polysilicon layer on the first insulation layer;
    a gate electrode disposed on the second insulation layer;
    a third insulation layer which covers the gate electrode on the second insulation layer;
    a first through hole and a second through hole in the second insulation layer and the third insulation layer, wherein the first through hole and the second through hole reveal a surface of the polysilicon layer; and
    a source electrode and the drain electrode disposed on the third insulation layer, wherein, the source electrode fills the first through hole and contacts the surface of the polysilicon layer, and the drain electrode fills the second through hole and contacts the surface of the polysilicon layer;
    wherein, the planarization layer is disposed on the third insulation layer and covers the source electrode and the drain electrode.

8. A manufacturing method for an array substrate of a liquid crystal panel, comprising:
    providing a substrate;
    forming a low-temperature poly-silicon thin-film transistor (LTPS TFT) above the substrate;
    forming a planarization layer which covers the LTPS TFT;
    forming a via hole in the planarization layer, wherein, the via hole reveals a drain electrode of the LTPS TFT;
    simultaneously forming multiple common electrodes and multiple receiving electrodes which are disposed separately on the planarization layer, wherein, the multiple common electrodes function as a driving electrode in a touch stage, and the multiple common electrodes which are disposed separately are connected with each other;
    forming a passivation layer which covers the multiple common electrodes and the multiple receiving electrodes and the planarization layer; and
    forming a pixel electrode on the passivation layer, wherein, the pixel electrode is contacted with the drain electrode through the via hole.

9. The manufacturing method according to claim 8, wherein, the manufacturing method further includes:
    after forming the passivation layer, forming a third through hole in the passivation layer, wherein the third through hole reveals the common electrode; and
    when forming the pixel electrode, simultaneously forming a connection electrode which is not contacted with the pixel electrode on the passivation layer;
    wherein, the connection electrode is contacted with the common electrodes through the third through hole such that the multiple common electrodes which are disposed separately are connected with each other.

10. The manufacturing method according to claim 8, wherein, the manufacturing method further includes:
    before forming the LTPS TFT, forming a light-shielding layer on the substrate, wherein, the light-shielding layer is disposed oppositely to the LTPS TFT; and
    forming a first insulation layer which covers the light-shielding layer on the substrate.

11. The manufacturing method according to claim 9, wherein, the manufacturing method further includes:
    before forming the LTPS TFT, forming a light-shielding layer on the substrate, wherein, the light-shielding layer is disposed oppositely to the LTPS TFT; and
    forming a first insulation layer which covers the light-shielding layer on the substrate.

12. The manufacturing method according to claim 8, wherein, the step of forming a LTPS TFT includes:
    forming a polysilicon layer on the first insulation layer;
    forming a second insulation layer which covers the polysilicon layer on the first insulation layer;
    forming a gate electrode on the second insulation layer;
    forming a third insulation layer which covers the gate electrode on the second insulation layer;
    forming a first through hole and a second through hole in the second insulation layer and the third insulation layer, wherein, the first through hole and the second through hole reveal a surface of the polysilicon layer; and forming a source electrode and the drain electrode on the third insulation layer, wherein, the source electrode fills the first through hole and contacts the surface of the polysilicon layer, and the drain electrode fills the second through hole and contacts the surface of the polysilicon layer;

wherein, the planarization layer is disposed on the third insulation layer and covers the source electrode and the drain electrode.

13. The manufacturing method according to claim 9, wherein, the step of forming a LTPS TFT includes:

forming a polysilicon layer on the first insulation layer;

forming a second insulation layer which covers the polysilicon layer on the first insulation layer;

forming a gate electrode on the second insulation layer;

forming a third insulation layer which covers the gate electrode on the second insulation layer;

forming a first through hole and a second through hole in the second insulation layer and the third insulation layer, wherein, the first through hole and the second through hole reveal a surface of the polysilicon layer; and forming a source electrode and the drain electrode on the third insulation layer, wherein, the source electrode fills the first through hole and contacts the surface of the polysilicon layer, and the drain electrode fills the second through hole and contacts the surface of the polysilicon layer;

wherein, the planarization layer is disposed on the third insulation layer and covers the source electrode and the drain electrode.

* * * * *